United States Patent [19]
Higashi et al.

[11] Patent Number: 5,825,712
[45] Date of Patent: Oct. 20, 1998

[54] SEMICONDUCTOR INTEGRATED CIRCUIT

[75] Inventors: Tomoki Higashi, Yokohama; Hiroyuki Noji, Chigasaki, both of Japan

[73] Assignee: Kabushiki Kaisha Toshiba, Kawasaki, Japan

[21] Appl. No.: 912,755

[22] Filed: Aug. 18, 1997

[30] Foreign Application Priority Data

Aug. 19, 1996 [JP] Japan ................................ 8-217399

[51] Int. Cl.$^6$ ....................................... G11C 7/00
[52] U.S. Cl. .............................. 365/230.03; 365/230.02; 365/189.02; 365/189.03
[58] Field of Search ......................... 365/230.03, 230.02, 365/189.02, 189.03, 189.09

[56] References Cited

U.S. PATENT DOCUMENTS

| | | | |
|---|---|---|---|
| 5,612,690 | 3/1997 | Jungroth et al. | 365/230.03 |
| 5,642,323 | 6/1997 | Kotani et al. | 365/63 |
| 5,712,827 | 1/1998 | Ogihara et al. | 365/230.03 |

*Primary Examiner*—Vu A. Le
*Attorney, Agent, or Firm*—Banner & Witcoff, Ltd.

[57] ABSTRACT

The present invention intends to provide a semiconductor device integrated circuit having an additive circuit capable of the evaluation of the dynamic performance of a memory block in a mixed logic and memory IC or a high-speed logic block in a semiconductor device integrated circuit, directly from the outside of the device. In order to evaluate the dynamic performance of the memory block or the high-speed logic block by using a tester, the device is provided on the chip with bus lines which bypass the peripheral logic and are connected to the input terminals of the memory block or the high-speed logic block. In the device, the delay time difference between the bus lines are measured from the outside of the device, at first. By use of the measurement result, the timing error of inputting a plurality of test pulse signals used for the dynamic performance evaluation is compensated. A switching element is provided between the reference line and each of the bus lines. A delay time measuring signal is input to each of external I/O pads connected to the bus line through which the delay time of the signal passing is measured, and then the differences in the delay time of all the bus lines are obtained on the basis of the signal delay time produced between the reference line and the each of the line. By use of the difference in the delay time of the lines, the input timing error when the memory block is measured with the tester is compensated, thereby precise evaluation of the memory block or the high-speed logic block is obtained.

16 Claims, 10 Drawing Sheets

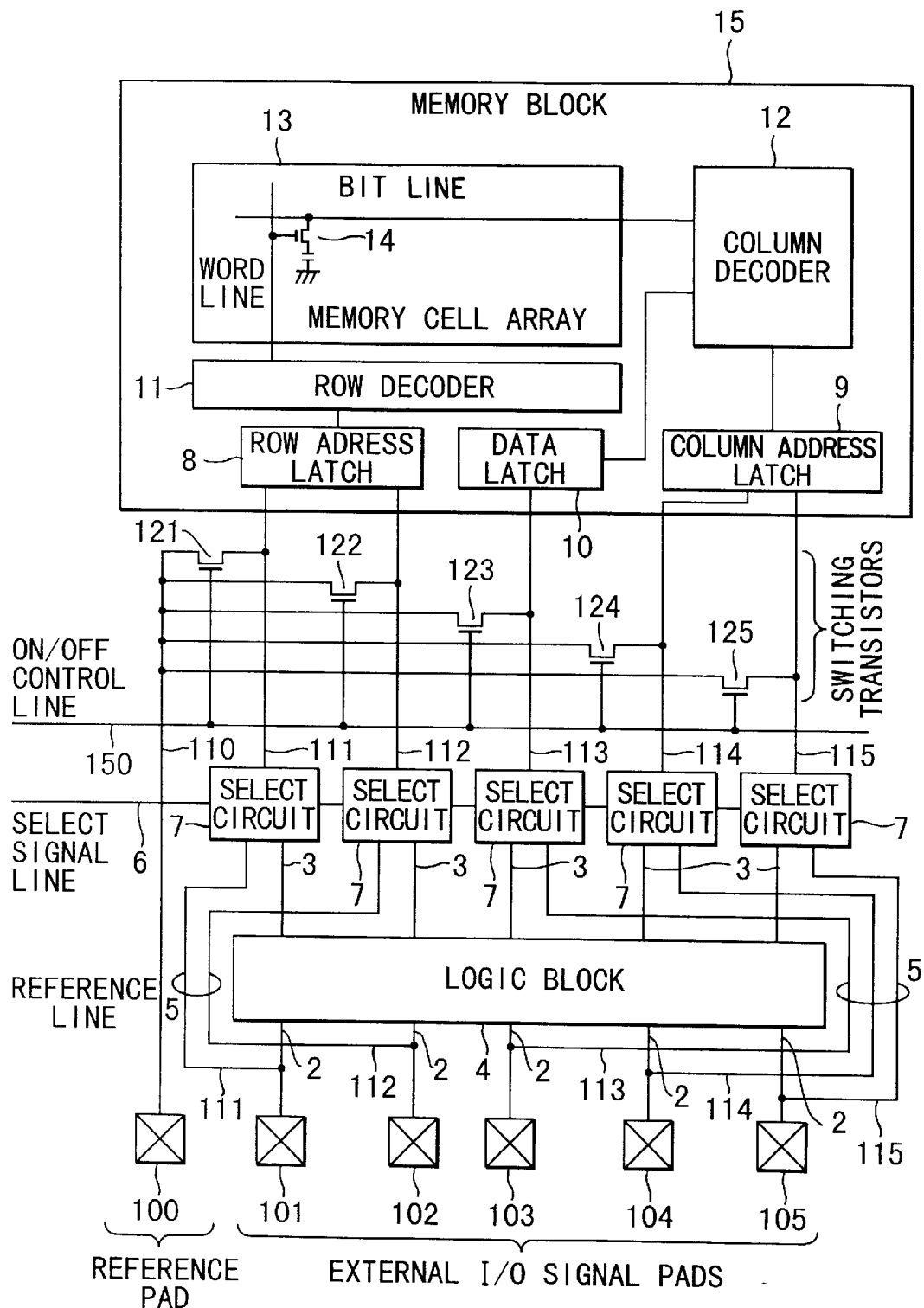
F I G. 2

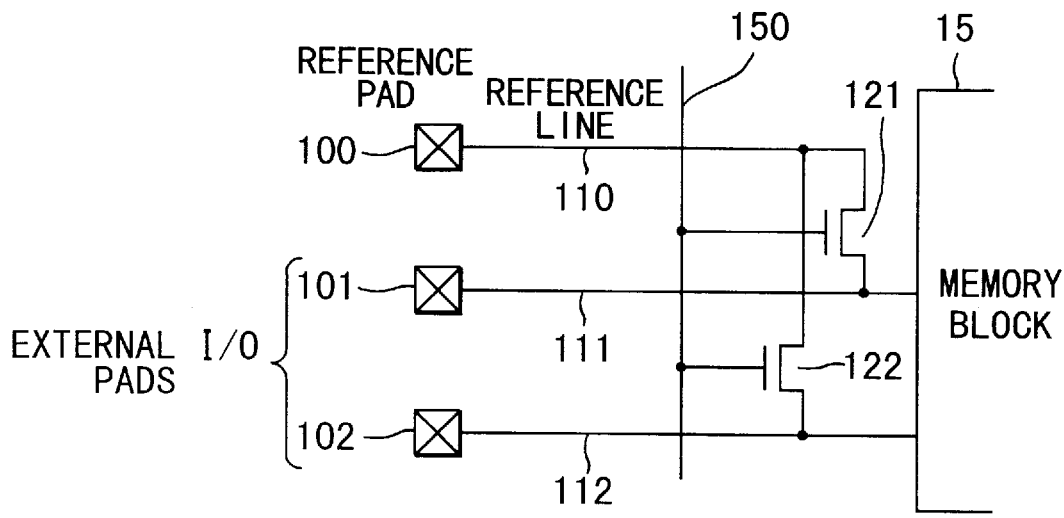
F I G. 3
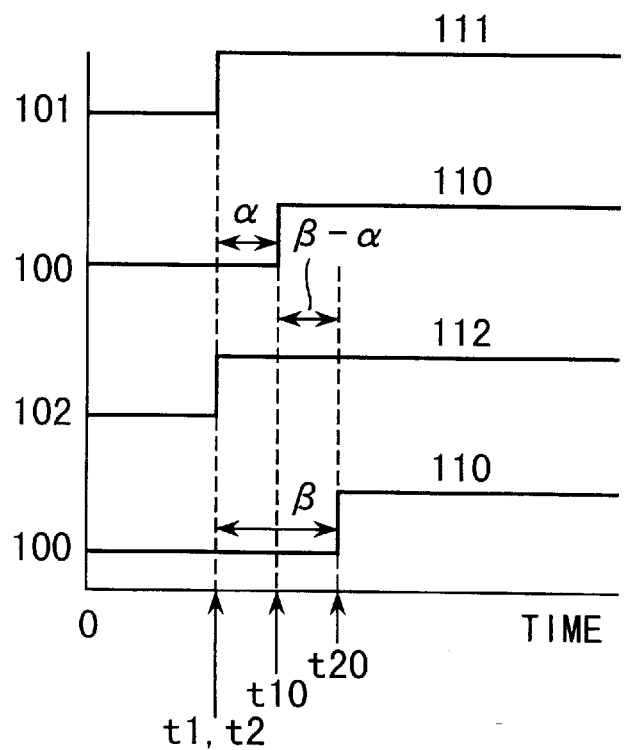
F I G. 4

SEMICONDUCTOR INTEGRATED CIRCUIT

BACKGROUND OF THE INVENTION

This invention relates to a semiconductor device integrated circuit in which logic and memory are formed on the same chip (hereinafter referred to as "mixed logic and memory IC") or a semiconductor device integrated circuit in which at least a first logic and a second logic are formed on the same chip, in particular, a semiconductor device integrated circuit capable of timing measurement of the memory or the first logic during high-speed operation.

A logic block and a memory block in a mixed logic and memory IC are different from each other in design methodology, and thus designed independently. After designing separately, the logic block and the memory block are connected to each other by bus lines, in general. The signal timing design of the mixed IC is performed after determining the delay time of the signal which is propagated in the bus lines provided at the interface between the logic block and the memory block.

Generally, the operation mode of the memory block in a mixed IC is controlled by supplying an external input signal through the peripheral logic circuit. While, in the case where the memory block is tested independently, the memory block is directly accessed. In the direct access, the signal similar to the interface signal used in the conventional memory is directly supplied to the memory block from the outside, and the obtained result is evaluated. Such a prior art of the present invention will be described below:

FIG. 1 shows that external signals are input to each of a plurality of pads 1 for external I/O signal and travel in two ways: one of the signals is input through lines 2 to a logic block 4 which controls the operation mode of a memory block 15; the other of the signals bypasses the logic block via lines 5. When the memory block 15 is directly tested from the outside. A signal for controlling select circuits 7 is input to a select signal line 6 from a memory tester by receiving the signal, the lines 5 as the bypass lines for bypassing the logic block 4 are selected, and then the signals are output from the select circuits 7.

In a mixed IC having the memory block comprising dynamic random access memories (hereinafter referred to as "DRAMs"), the test of the memory block is performed by inputting row address strobe signal (hereinafter referred to as "RAS"), column address strobe signal (hereinafter referred to as "CAS"), and address signal from the external signal input pads 1, similarly to the test of the conventional DRAM. When the RAS signal is input, a row address is selected via a row address latch 8 and a row decoder 11. Similarly, when the CAS signal is input, a column address is selected via a column address latch 9 and a column decoder 12.

In the above-mentioned manner, one of memory cells 14 which constitute a memory cell array 13 is selected, and data is written in or read out from the selected memory cell. In the data writing, the data is supplied to a data latch 10 after one of the memory cells 14 is selected, and then the data is written in the selected memory cell.

When only the memory block is tested directly from the outside by use of a plurality of external I/O signal pads, measurement signals input from the pads bypass the logic block 4 and is propagated in a plurality of signal lines each extending to the input terminals of the memory block through one of the select circuits 7. In order to suppress the error in the input timing of the high-speed pulse signals used for the measurement, the signal lines are designed to have an equal signal delay time.

However, if the manufacturing conditions are fluctuated, there will occur the variation in the wiring capacitance due to the variation in the thickness of interlayer insulators, or the change of the wiring resistance due to the variation of the width or thickness of the metalization of the wiring. With this change or the variation, the signal delay time in each of the signal lines varies and is deviated from the designed value. The variation in the signal delay time in the lines due to the fluctuation of the manufacturing conditions occurs not only between different chips but also on the same chip. The delay time variation on the same chip is not negligibly small one. It is thus quite difficult in the conventional device to precisely evaluate the signal input timing among a plurality of signal lines constituting the data bus.

The conventional mixed logic and memory IC has the above-mentioned problem which have occurred when the dynamic properties of the memory block are measured directly from the outside by inputting measuring signals so as to bypass the logic block. Similar problems will occur also in the semiconductor device integrated circuit such as ALU (Arithmetic Logic Unit) and parallel multiplier, wherein a high-speed logic and the peripheral logic are formed on the same chip. With such an IC having a high-speed logic as a first logic block and the peripheral logic as a second logic block, the dynamic properties of the first logic block such as ALU and the parallel multiplier, which operates at a high-speed, need to be directly tested by using test signals by inputting the signals from the external I/O signal pads so as to bypass the second logic block as the peripheral logic. In order to prevent error in inputting timing of the high-speed pulse test signals into the first logic block, the delay time of each of the test signals, i.e., the period of time during which the test signal is input from the external I/O signal pads, bypass the second logic block, passes a select circuit 7, and reaches the input terminal of the first logic block through a plurality of signal lines, needs to be equal to each other, similarly to the mixed IC. However, the signal delay time in practical use is deviated from the designed value due to the variation of the manufacturing conditions.

As described above, it has been very difficult to precisely measure the signal delay time in the mixed IC, and thus a plurality of measuring high-speed pulse signals cannot be correctly input at inputting timing, resulting in errors in the access time to the memory block. This problem will occurs also in the semiconductor device integrated circuit having a high-speed logic such as ALU and parallel multiplier and the peripheral logic on the same chip when the properties of the high-speed logic are tested directly from the outside.

The present invention thus intends to solve the above-mentioned problem by providing a mixed logic and memory IC or a semiconductor device integrated circuit having a high-speed logic and a peripheral logic, which is added with a simple additive circuit enabling to precisely measure the signal delay time between a plurality of high-speed pulse signals each propagated through a plurality of lines which constitute a data bus, thereby attain precise evaluation of the operation.

BRIEF SUMMARY OF THE INVENTION

The semiconductor device integrated circuit of the present invention comprises a logic block which receives a plurality of external input signals and outputs control signals controlling operation of a random access memory block, a plurality of select circuits each selecting either external input signals bypassing the logic block by receiving an external select signal or control signals output from the logic block, bus lines each connected to the corresponding one of the outputs of the select circuits, a reference line which is arranged near the bus lines and used to measure signal delay time between lines constituting data bus, a plurality of switching transistors connecting the reference line and the lines constituting the data bus, and a ON/OFF control line for controlling the ON/Off of the switching transistors.

As described above, the semiconductor device integrated circuit of the present invention turns on the switching transistors to connect the reference line and the lines constituting the data bus, in measuring the signal delay time between lines constituting data bus. While the mixed IC normally operates, the switching transistors are turned off to be disconnected from the reference line.

It is preferable for the present invention to provide a control circuit for selecting one of the switching transistors which connects the reference line and one of the lines in which the delay time of the signal measured, and controlling the select circuit to turn on/off. By providing the control circuit, reliable measurement result can be attained.

It is further preferable for the present invention to provide a plurality of separation transistors and a plurality of separation control lines which disconnected and separate the memory block from the bus lines, such that the multiple reflection of the delay time measuring signal on the memory block is prevented.

The semiconductor device integrated circuit of the present invention is further characterized in that one of the lines constituting the data bus is assigned as a temporary reference line and connected to the other lines constituting the data bus, thereby the signal delay time between the bus lines can be measured even if no special reference line is provided. By measuring the signal delay time between all the bus line pairs, the signal delay time in all of the lines constituting the data bus can be attained.

Similarly to the aforementioned semiconductor device integrated circuit, the above-mentioned semiconductor device integrated circuit using one of the bus lines as a temporary reference line can also select one of the switching transistors, control the switching transistor to turn ON/OFF by the control circuit, and prevent the multiple reflection of the delay time measuring signal on the memory block by using a plurality of separation transistors for separating the memory block from the bus lines.

In the mixed logic and memory IC constituted as above, the signal delay time between a plurality of lines constituting data bus can be easily measured from the outside using a tester, and thus the dynamic performance of the memory block which operates at high speed can be easily evaluated at a precise access timing for each of the supplied devices.

The semiconductor device integrated circuit of the present invention still further characterized by comprising the first logic block and the second logic block which controls the operation of the first logic block on the same chip, the first logic block and the second logic block correspond to the memory block and logic block of the mixed logic and memory IC, respectively.

Also in the semiconductor device integrated circuit having at least the first logic block and the second logic block both formed on the same chip, the signal delay time between a plurality of lines constituting the data bus can be easily measured from the outside using a tester, and thus the dynamic performance of the first logic block which operates at high speed can be easily evaluated at a precise access timing for each of the supplied devices.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

The present invention best understood by reference to accompanying drawings, in which:

FIG. 2 is a schematic view of a mixed logic and memory IC having an interwiring delay time measurement circuit according to the first embodiment of the present invention;

FIG. 3 is a block diagram of the interwiring delay time measurement circuit according to the first embodiment of the present invention;

FIG. 4 is a timing chart showing the measuring method of the interwiring delay time according to the first embodiment of the present invention;

DETAILED DESCRIPTION OF THE INVENTION

Figure 1:
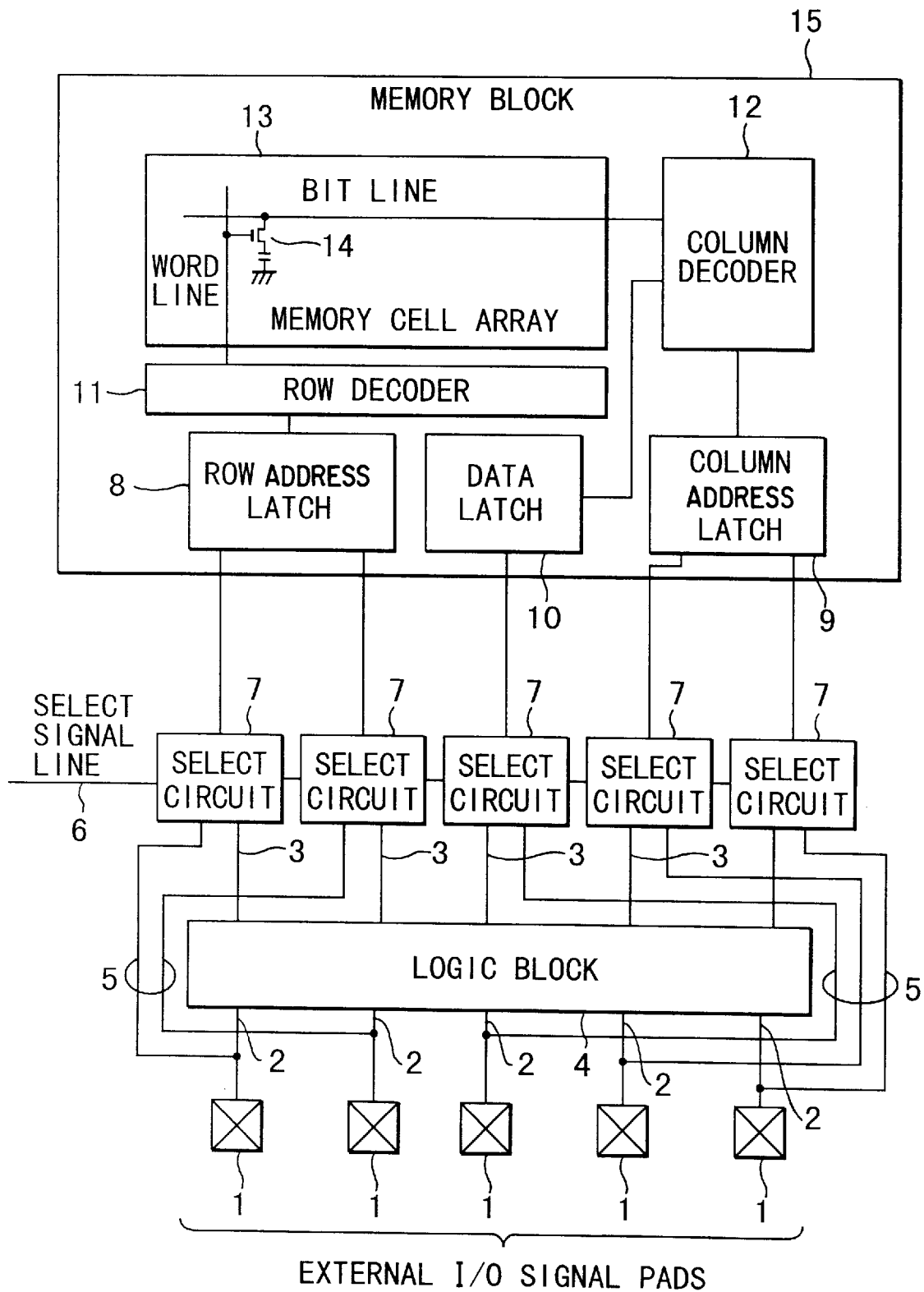
FIG. 1 is a schematic view of the conventional mixed logic and memory IC.

This invention can be more fully understood from the following detailed description when taken in conjunction with the accompanying drawings. FIG. 2 is a schematic view of a mixed logic and memory IC having an interwiring delay time measurement circuit according to the first embodiment of the present invention. The following is the description of a select signal line 6 and an ON/OFF control line 150 shown in FIG. 2.

The external input signals output from each of pads 101–105 are divided into two signals: one of which directly enters into a logic block 4 through lines 2; and the other of which bypasses the logic block via bus lines 5. In measuring the signal in a memory block 15 using a tester, a select circuit control signal for controlling a plurality of select circuits 7 are input into the select signal line 6 such that output lines 3 of the logic block 4 are disconnected from the select circuits and the bus line 5 for bypassing the logic block 4 are selected to be connected with the outputs of the select circuits 7.

In order to simplify the description, the bypass lines connected to the pads 101–105 are denoted as 111–115. The measuring signals output from the tester and bypassing the logic block 4 pass through the external I/O pads 101–105 and lines 111–115, and enter into the output terminals of the select circuits 7. The lines between the outputs of the select circuits 7 and the input of the memory block 15, which are also denoted as 111–115, form a data bus of the logic-memory interface, connected to a plurality of lines 5 by the select circuits 7.

To precisely, the delay time necessary for the evaluation of the memory block by inputting signals through external I/O signal pads 101–105 with use of the tester is the delay time of a signal each propagated from the external I/O signal pads to the input terminal of the memory block 15. Accordingly, the delay time of the bus lines described in this embodiment includes the delay time produced in the lines 5 and the select circuits 7.

In the first embodiment, the device is provided with a reference pad 100 and a reference line 110 arranged near the lines 111–115 constituting the data bus and connected to the lines 111–115 constituting the data bus so as to locate switching transistors 121–125 therebetween. The gates of the switching transistors are connected to a ON/OFF control line 150.

FIG. 3 is a block diagram showing the principle of measurement of the delay time between the lines constituting the data bus. The reference numerals shown in FIG. 3 correspond to those of FIG. 2. FIG. 4 shows the relationship between the passed time and the rising points of measuring pulse signals for measuring the delay time between the bus lines at the pads. The reference numerals 100, 101, and 102 on a vertical axis of the timing chart of FIG. 4 respectively represent the waveforms of the measurement pulse signals measured at the pads of the corresponding numbers. The reference numerals 110, 111, and 112 respectively represent the lines which are connected to the corresponding pads and the pulse signals are propagated in.

The measurement of the delay time between the lines 111 and 112 shown in FIG. 3 will be described below. Prior to the measurement, the ON/OFF control line 150 is set at a positive potential level to turn on the switching transistors 121 and 122.

The measurement of the line 111 will be described at first. The measuring pulse signal is input from the tester to the pad 101 at time $t_1$ to measure the delay time in the line 111, as shown in FIG. 4. In this time, the switching transistor 121 has been already turned on as described above. The measuring pulse signal input from the pad 101 thus passes through the line 111, switching transistor 121, and reference line 110, and then is output from the reference pad 100 and rises at the pad 100 at time $t_{10}$, as shown in the waveform 110 (the second waveform from the above) of FIG. 4. The signal delay time $\alpha = t_{10} - t_1$ is then measured using the tester.

The measurement of the line 112 will be described next. The measuring pulse signal is input from the tester to the pad 102 at time $t_2$ to measure the delay time in the line 112, as shown in FIG. 4. In this time, the switching transistor 122 has been already turned on as described above, and thus the measuring pulse signal input from the pad 102 passes through the line 112, switching transistor 122, and reference line 110, and then is output from the reference pad 100 and rises at the pad 100 at time $t_{20}$, as shown in the waveform 110 (the fourth waveform from the above) of FIG. 4. The signal delay time $\beta = t_{20} - t_2$ is then measured using the tester.

To clearly show the relationship between the delay times $\alpha$ and $\beta$, the input times $t_1$, and $t_2$ at which the signals are respectively input to pads 101 and 102 are located at the same point in the timing chart of FIG. 4. The delay time difference $\beta - \alpha$ between the lines 111 and 112, i.e., the interline delay time difference, is the essential parameter for the measurement of the delay time at the memory block. The delay time between all the arbitrary two of the lines constituting a plurality of bus lines (111–115 in the example of FIG. 2) can be obtained in the similar manner.

When the dynamic performance of the memory block 15 is evaluated by inputting the measuring signals via the bus lines 111–115 for bypassing the logic block 4 shown in FIG. 2 from the outside with use of the tester, the memory access at the precise timing can be attained by compensating the inputting timing of the signals from the tester to the external input signal pads 101–105 on the basis of the delay time difference between the lines, and thus the performance of the memory block can be precisely evaluated. More specifically, the precise access to the memory block can be attained by inputting the measuring pulse signal to the external input signal pad 102 earlier than the input signal input to the pad 101 by the delay time difference $\beta - \alpha$.

Next, the second embodiment of the present invention will be described below with reference to FIG. 5.

Each of the select circuits 7 are disconnected from the output lines 3 of the logic block 4 by inputting a select signal for controlling a plurality of select circuits 7 into a select signal line 6, and selects the line 5 constituting the bypassing data bus.

Figure 5:
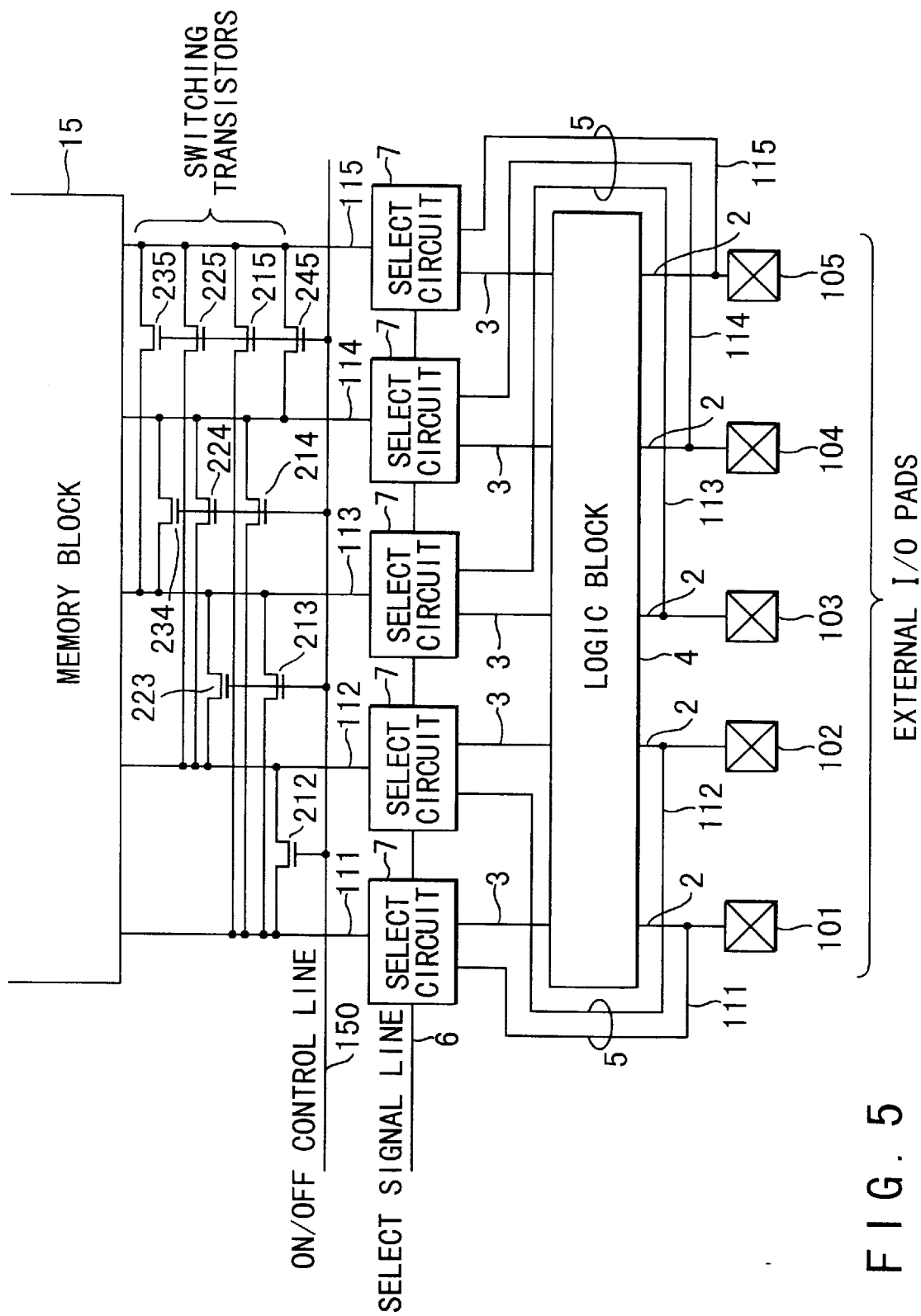
FIG. 5 is a schematic view of a mixed logic and memory IC having an interwiring delay time measurement circuit according to the second embodiment of the present invention.

As shown in FIG. 5, each pair among the plurality of lines 5 constituting the bypassing data bus are connected to each other with use of the switching transistors 212–215, 223–225, 234, 235, and 245. The switching transistors are connected to a ON/OFF control line 150 at the gates, and turned on/off by signals propagated from the control line 150.

Figure 6:
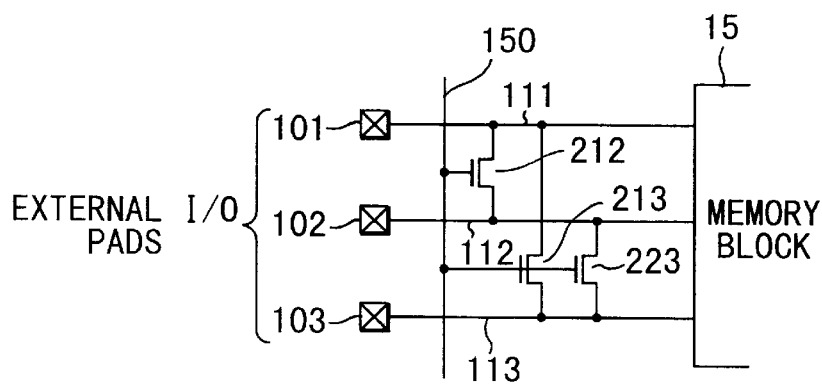
FIG. 6 is a block diagram of the interwiring delay time measurement circuit according to the second embodiment of the present invention.
Figure 7A:
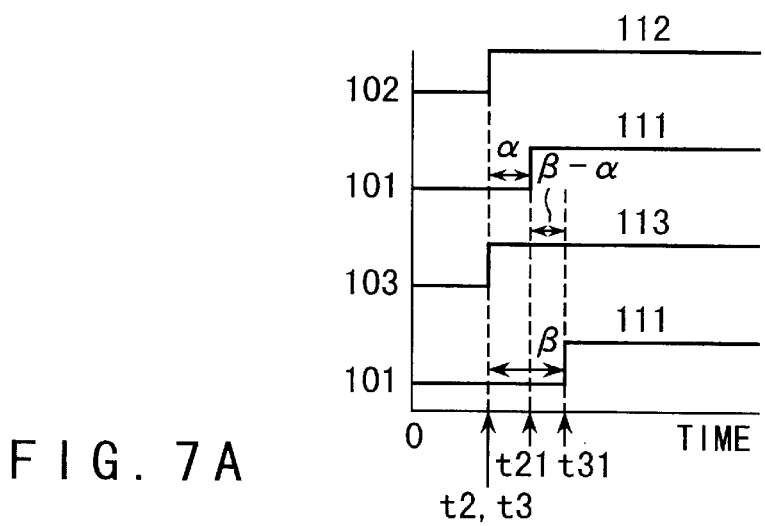
FIG. 7A is a timing chart showing the measuring method of the interwiring delay time according to the second embodiment of the present invention.
Figure 7B:
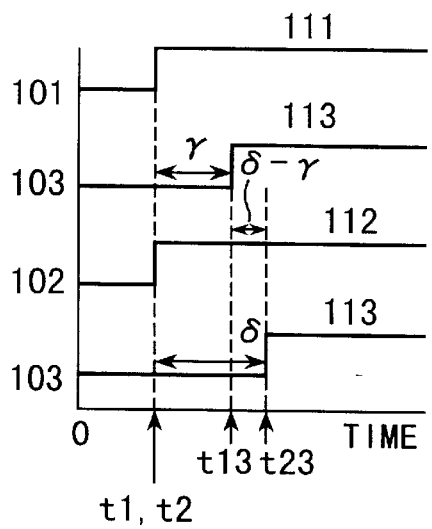
FIG. 7B is the other timing chart showing the measuring method of the interwiring delay time according to the second embodiment of the present invention.

FIG. 6 is a block diagram showing the principle of measurement of the delay time between the lines constituting the data bus. The reference numerals shown in FIG. 6 correspond to those of FIG. 5. FIGS. 7A and 7B show the relationship between the passed time and the rising points of measuring pulse signals for measuring the delay time between the bus lines at the pads.

In the first embodiment, the difference in the delay time between the lines constituting the data bus is obtained by inputting the measuring signal into the line in which the signal delay time is to be measured and then outputting the measuring pulse signal from the reference pad with use of the switching transistor and the reference line. While, to the device of the second embodiment, no special reference line or reference pad is provided. In the measurement in the second embodiment, one of a plurality of the lines constituting the data bus and one of the external I/O signal pad are designated as a temporary reference line and a temporary reference pad, and the difference in delay time between the other two lines is obtained by using them. According to the second embodiment, the measurement of the delay time difference is performed for each of the line pair in order.

FIGS. 6, 7A, and 7B show the method for obtaining the delay time difference in the data bus constituted by three lines. The reference numerals of FIG. 6 correspond to those of FIG. 5. The reference numerals of FIGS. 7A and 7B indicate the same elements as those of FIG. 4, and the description thereof is omitted.

Prior to the measurement, the ON/OFF control line 150 is set at a positive potential level to turn on switching transistors 212, 213, and 223.

As the first stage, a pad 101 is designated as a temporary reference pad, and a line 111 which constitutes one of the data bus, and is connected to the temporary reference pad is determined as a temporary reference line.

A measurement of the line 112 of FIG. 6 will be described at first. The measuring pulse signal is input from the tester to a pad 102 at time $t_2$ to measure the delay time in a line 112, as shown in FIG. 7A. In this time, the switching transistor 212 has been already turned on as described above. The measuring pulse signal input from the pad 102 thus passes through the line 112, switching transistor 212, and temporary reference line 111, and then is output from the temporary reference pad 101, and rises at the pad 101 at time $t_{21}$, as shown in the waveform 111 (the second waveform from the above) of FIG. 7A. The signal delay time $\alpha=t_{21}-t_2$ is then measured using the tester.

The measurement of the line 113 will be described next. The measuring pulse signal is input from the tester to a pad 103 at time $t_3$ to measure the delay time in a line 113, as shown in FIG. 7A. In this time, the switching transistor 213 has been already turned on as aforementioned, and thus the measuring pulse signal input from the pad 103 passes through the line 113, switching transistor 213, and temporary reference line 111, and then is output from the reference pad 101 and rises at the pad 101 at time $t_{31}$, as shown in a waveform 111 (the fourth waveform from the above) of FIG. 7A. The signal delay time $\beta=t_{31}-t_3$ is then measured using the tester.

To clearly show the relationship between the delay times $\alpha$ and $\beta$, the input times $t_2$ and $t_3$ at which the signals are input to pads 102 and 103, respectively, are shown at the same point in the timing chart of FIG. 7A. The delay time difference between the lines 112 and 113 can be obtained in this manner.

The second stage of the measurement is subsequently performed. In this stage, the pad 103 is designated as a temporary reference pad, and the line 113, which is one of the lines constituting the data bus, and connected to the temporary reference pad is designated as a temporary reference line. In this stage, the measurement of the line 111 of FIG. 6 is performed. The measuring pulse signal is input from the tester to the pad 101 at time $t_1$ to measure the delay time in the line 111, as shown in FIG. 7B. In this time, the switching transistor 213 has been already turned on, and thus the measuring pulse signal input from the pad 101 passes through the line 111, switching transistor 213, and temporary reference line 113, and then is output from the reference pad 103 and rises at the pad 103 at time $t_{13}$, as shown in a waveform 113 (the second waveform from the above) of FIG. 7B. The signal delay time $\gamma=t_{13}-t_1$ is then measured by use of the tester.

The measurement of the line 112 will be described next. The measuring pulse signal is input from the tester to a pad 102 at time $t_2$ to measure the delay time in the line 112. In this time, the switching transistor 223 has been already turned on, and thus the measuring pulse signal input from the pad 102 passes through the line 112, switching transistor 223, and temporary reference line 113, and then is output from the reference pad 103 and rises at the pad 103 at time $t_{23}$, as shown in the waveform 113 (the fourth waveform from the above) of FIG. 7B. The signal delay time $\delta=t_{23}-t_2$ is then measured using the tester. To clearly show the relationship between the delay times $\gamma$ and $\delta$, the input times $t_1$ and $t_2$ at which the signals are respectively input to pads 101 and 102 are shown at the same point in the timing chart of FIG. 7B. In this manner, the delay time difference $\delta-\gamma$ between the bus lines 111 and 112 are obtained.

As described above, according to the method shown in the second embodiment, the interline delay time difference between the arbitrary pair lines among the three bus lines 111, 112, and 113 can be obtained similarly to the first embodiment, with no special reference line or reference pad.

According to this method, the interline delay time difference between the arbitrary pair among a plurality of lines (the lines 111"115, for example of FIG. 5) constituting the other data bus can be also obtained in the same manner. Therefore, by compensating the delay time difference between the lines, the memory access can be performed at a precise timing when the evaluation of the operation performance of the memory block 15 is performed by inputting the signals with use of the tester from the outside.

The chip of the second embodiment need not to be provided with the reference line or the reference pad used in the first embodiment, and thus the increase of the chip area can be suppressed in comparing with the first embodiment.

Figure 8:
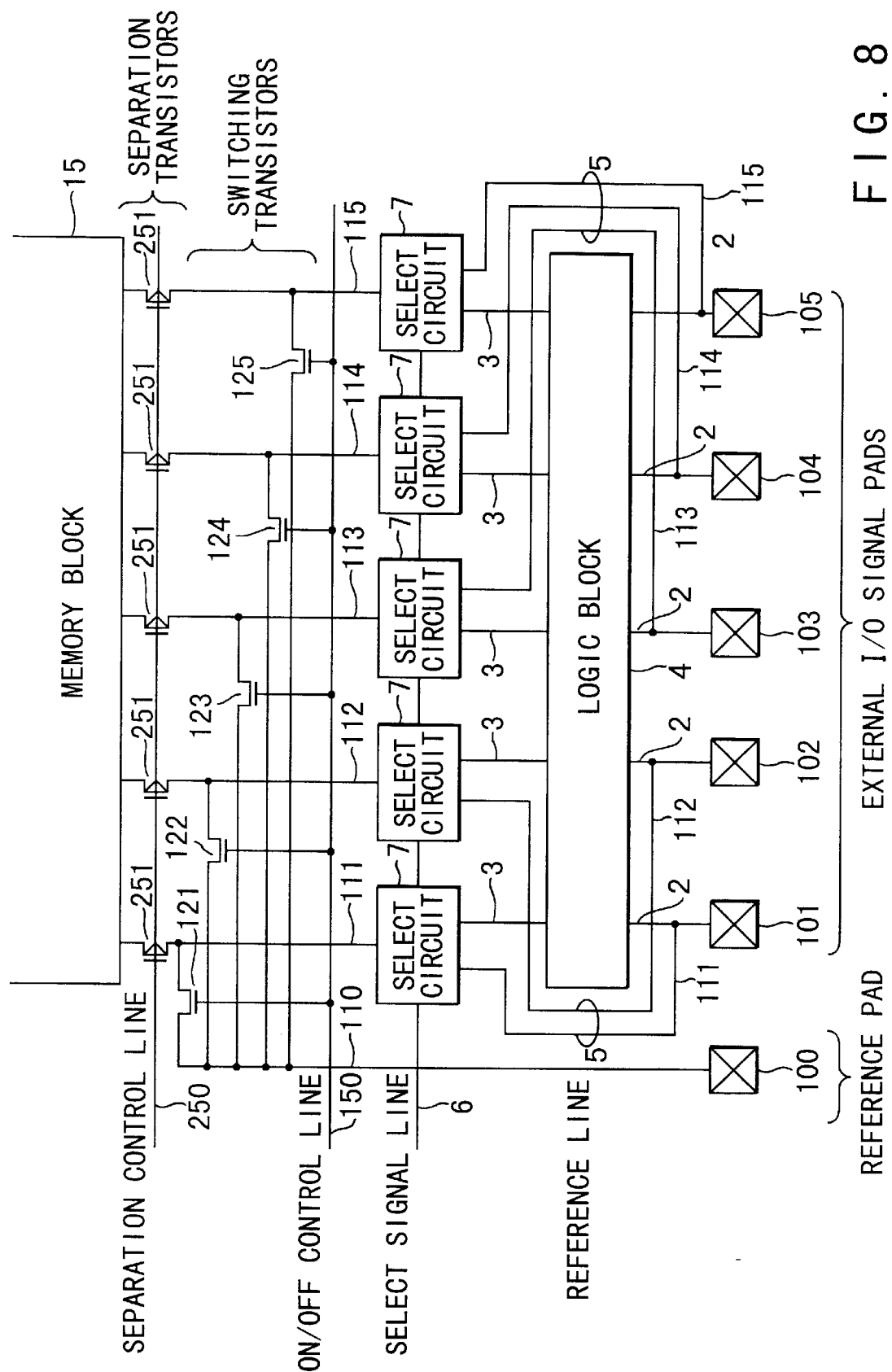
FIG. 8 is a modification of the first embodiment of the present invention, to which memory block separation transistors are provided.
Figure 9:
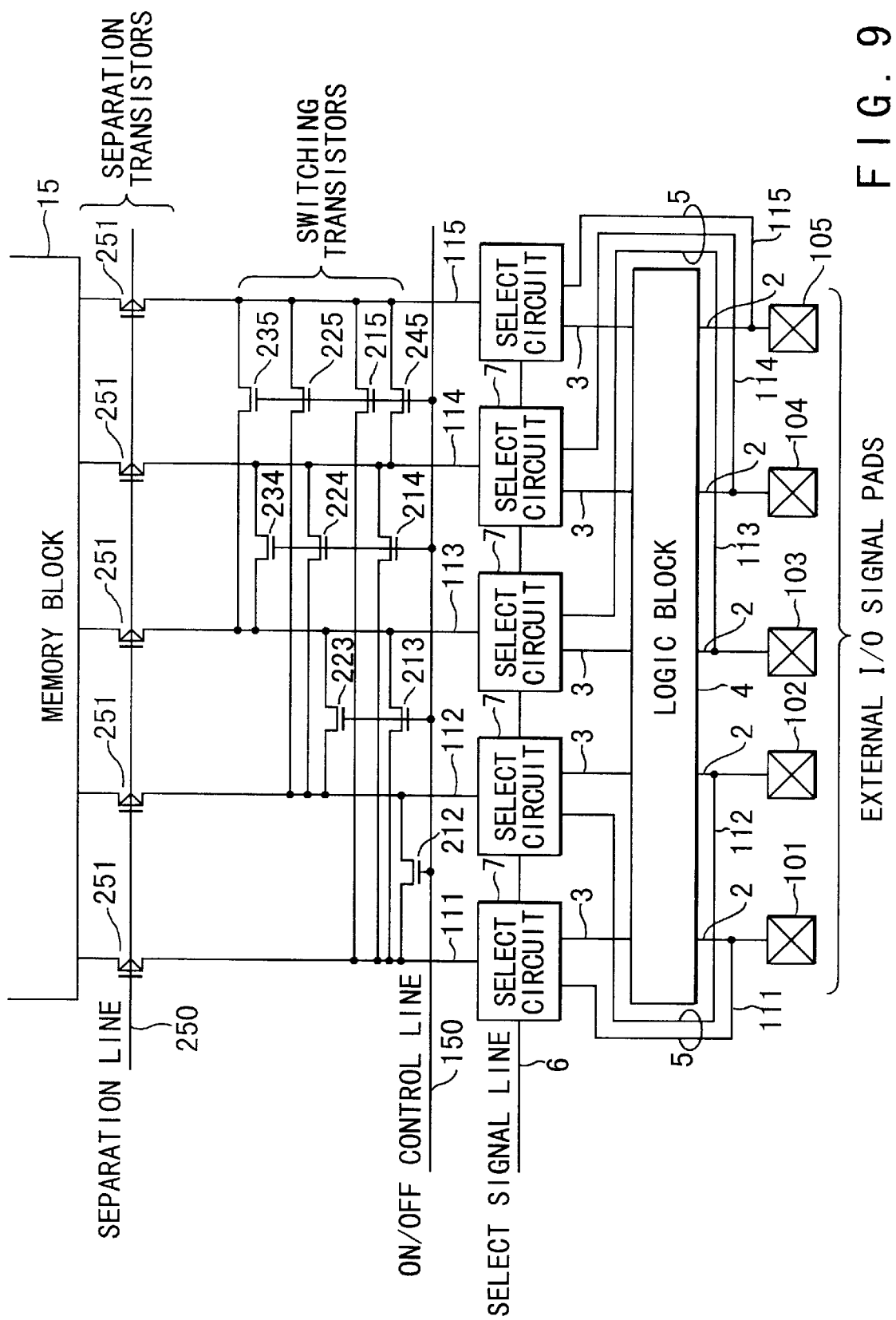
FIG. 9 is a modification of the second embodiment of the present invention, to which memory block separation transistors are provided.

FIGS. 8 and 9 are drawings respectively showing the method of providing with five p-channel transistors 251 for separating the bus lines 111–115 to be adjacent to the input of the memory block 15, to the device shown in FIGS. 2 and 5.

By providing the transistors, the measurement of the delay time between the bus lines can be prevented from being affected by the complicated multiple reflection of the measuring signal from the memory block. With this method, the bus line through which the measuring signal is input to the memory block is disconnected from the memory block at a reference point by applying a positive voltage to a separation control line 250. By disconnecting the bus line from the memory block in this manner, a delay time measuring pulse signal which is multi-reflected by the memory block can be discriminated very easily. By discriminating the multi-reflected signal, the measuring error can be prevented.

Each of the separation transistors 251 are formed to have a p-channel. If the switching transistors used for the delay time measurement are each formed to have a n-channel and the separation transistors each has a p-channel, the input terminals of the memory block 15 can be disconnected from the separation transistors 251 together with the delay time measurement when a control signal supplied to the ON/OFF control line for controlling the switching transistors having a n-channel is also input to the gates of the separation transistors 251 having a p-channel.

Figure 10:
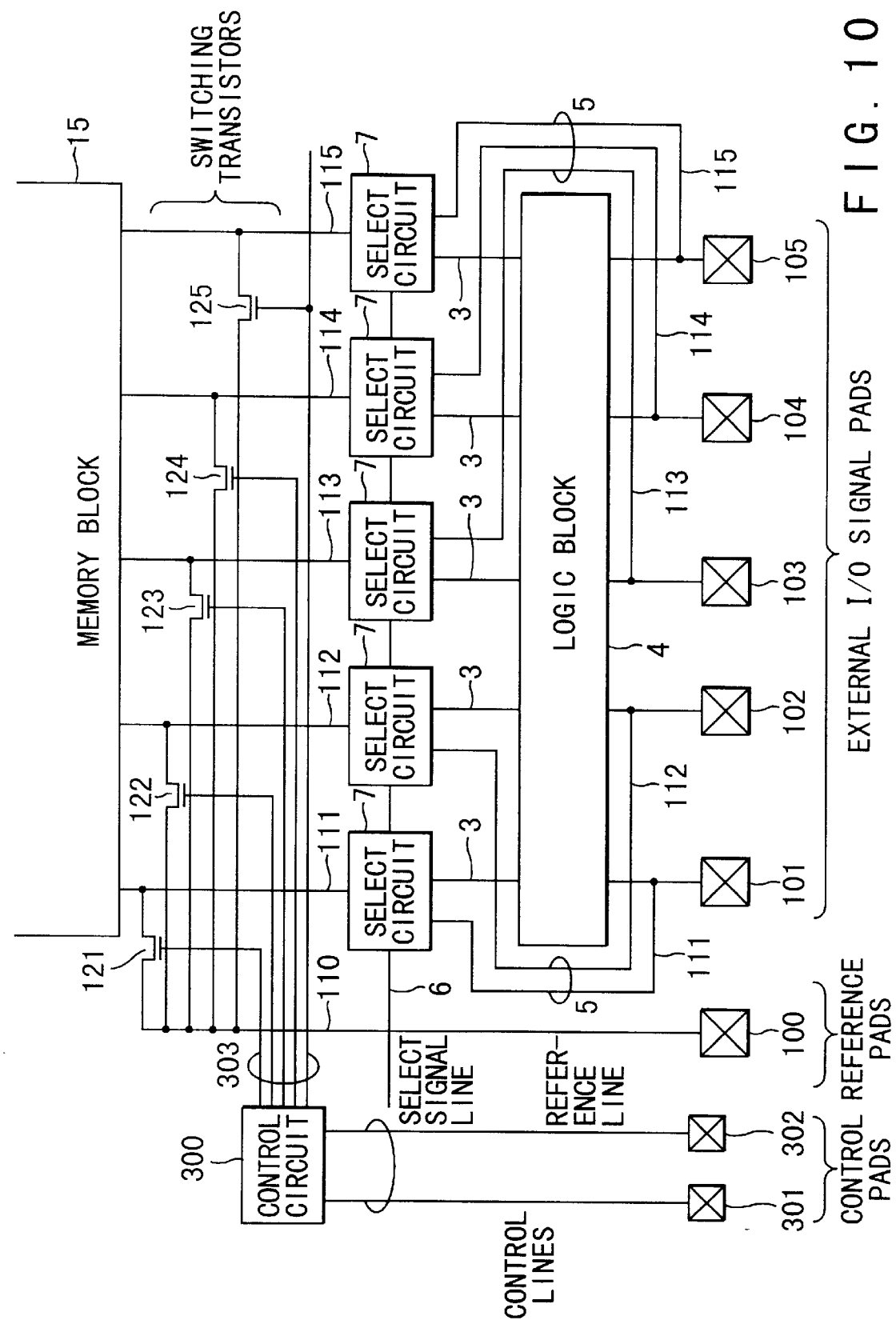
FIG. 10 is the other modification of the first embodiment of the present invention, to which a control circuit for delay time measurement transistors is provided.
Figure 11:
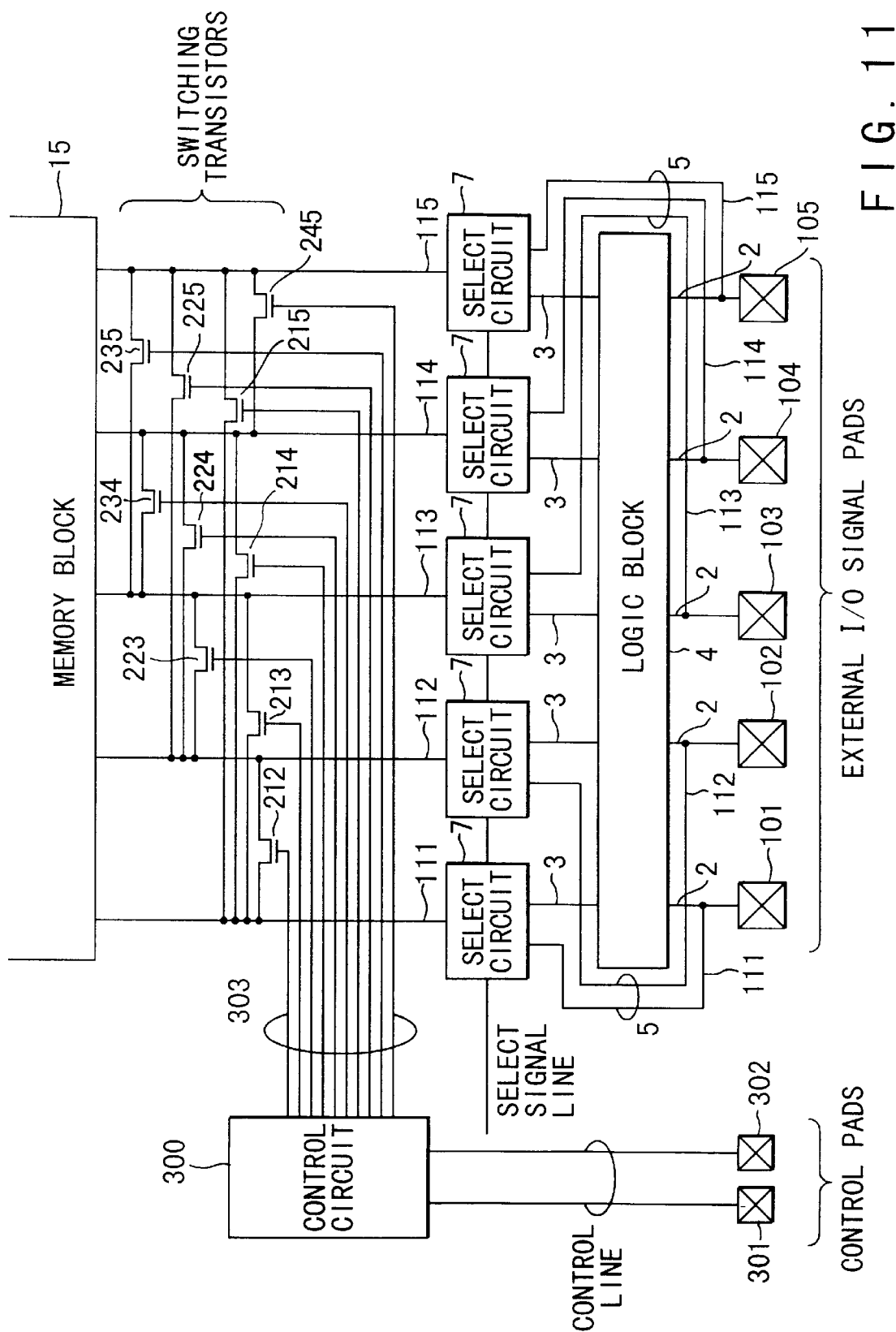
FIG. 11 is the other modification of the second embodiment of the present invention, to which a control circuit for delay time measurement transistors is provided.

FIGS. 10 and 11 respectively show a method of providing control pads 301 and 302 for controlling the switching of the switching transistors and a control circuit 300, to a device shown in FIGS. 2 and 5.

In the device shown in FIGS. 2 and 5, all the switching transistors are simultaneously turned on by using the ON/OFF control line in the measurement of the delay time. However, in turning on the switching transistors, the line in which the signal delay time is to be measured is connected to the other lines as a branch, and the multiple reflection of the signal may occur.

In order to prevent the multiple reflection of the signal in the device shown in FIG. 2, it is preferable to select only the switching transistor which connects one of a plurality of lines constituting a bus with the reference line so as to turn the switching transistor on and to turn the other switching transistors off to disconnect the line from the other lines constituting the data bus. In the case of the device of FIG. 5, it is preferable to connect only a temporary reference line and one of the lines constituting the data bus, through which the measuring signal is input, and to disconnect the other lines therefrom.

In order to perform the above-mentioned methods, the control circuit 300 shown in FIGS. 10 and 11 for selecting one of the switching transistors in every measurement of the delay time of the bus line needs to be provided. A shift register constituted by flip-flop circuits can be used as the control circuit.

Figure 12A:
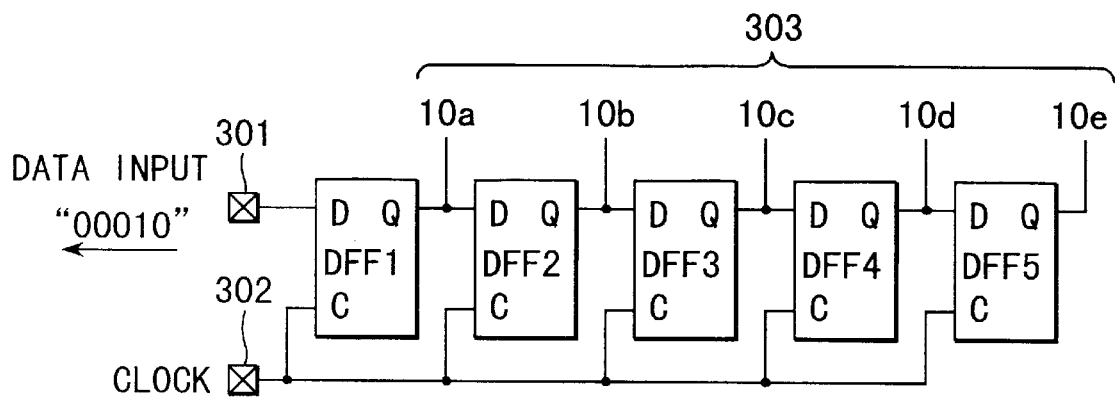
FIG. 12A is a schematic view of the shift register used for a control circuit of the delay time measurement transistors.
Figure 12B:
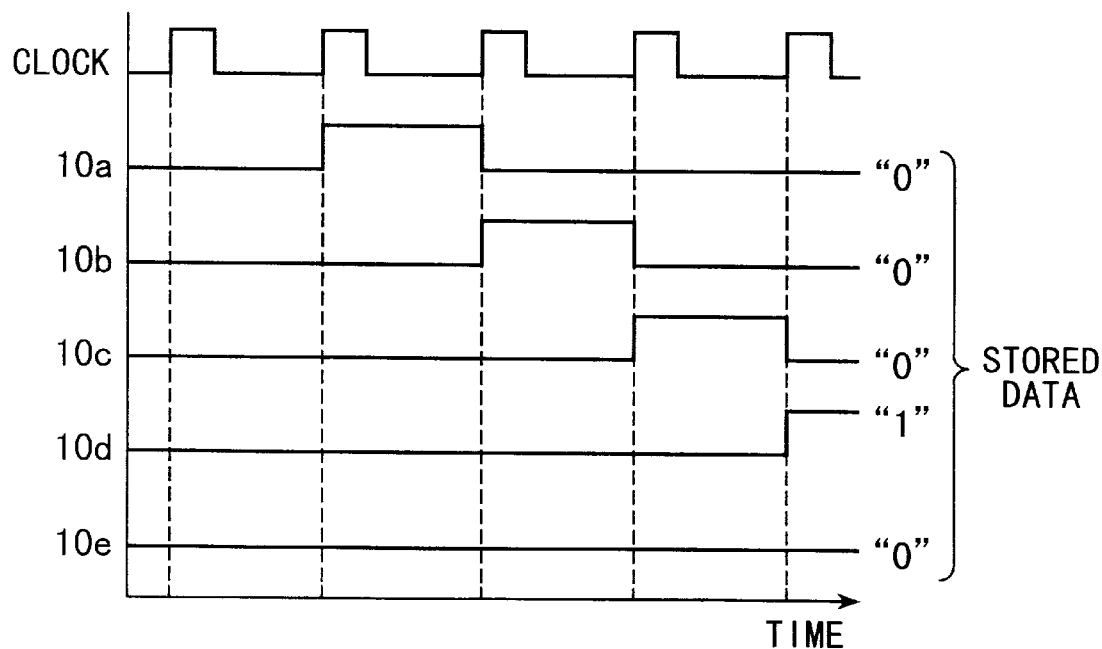
FIG. 12B is a timing chart of the operation of the shift register used for a control circuit of the delay time measurement transistors.

FIG. 12A shows an example of the flip-flop circuits. FIG. 12B is the timing diagram showing the operation of the flip-flop circuits. Reference numerals 10a–10e of FIG. 12A show a plurality of lines constituting the bus line 303 connected to the gates of the switching transistors shown in FIGS. 10 and 11. Data signal input terminal 301 and clock signal input terminal 302 respectively correspond to control pads 301 and 302 shown in FIGS. 10 and 11.

The following is the description of the case wherein only the switching transistor, a gate of which is connected to the line 10d, is turned on with this flip-flop circuit. Data "00010" is input from the data signal input terminal 301 so as to synchronize with the input timing of a clock pulse signal input from the clock signal input terminal. The arrow provided under data "00010" in FIG. 12A shows the direction in which the data is input in series.

As shown in the right end of FIG. 12B, the data "00010" is input to the lines 10a–10e by storing the data "00010" in the shift register comprising DFF1–DFF5 ("DFF" is the abbreviation of "Delayed Flip-Flop") in accordance with five clock pulse signals. By inputting the data "00010" in this manner, only the line 10d is set at a high potential level, and the switching transistor connected to the line is turned on. The switching transistor which connects one of the five lines constituting the data bus with the reference line is selected by inputting data with five bits in such a manner. It goes without saying that the switching transistor connecting one of the five lines constituting the data bus with the reference line is selected in the same manner even if the number of the lines increases.

In the above-mentioned embodiments, the constitution of the semiconductor device integrated circuit comprising the additive circuit capable of measuring the dynamic performance of the memory block by inputting the measuring signal directly from the outside with use of the tester, and making the signal bypass the logic block, with a correct waveform at a precise timing for the mixed logic and memory IC are described above. Such a constitution, can be realized in the devices other than the mixed logic and memory IC.

For example, also in the semiconductor device integrated circuit wherein a high-speed logic block such as ALU and parallel multiplier and the peripheral logic block are formed on the same chip, both the additive circuits employed in the first and second embodiments for measuring the mixed logic and memory IC can be used for evaluating the dynamic performance of the high-speed logic block by inputting the measuring signal directly from the outside with use of the tester and making the signal bypass the peripheral logic block.

In this integrated circuit, the high-speed logic block as the first logic block corresponds to the memory block having a plurality of input terminals in the mixed logic and memory IC, and the peripheral logic block as the second logic block having a plurality of input terminals connected to external I/O signal pads and a plurality of output terminals for outputting signals which control the first logic block corresponds to the logic block of the mixed logic and memory IC in the aforementioned embodiment. When the output terminals of the second logic block and the input terminals of the first logic block are connected by bus lines, the evaluation process shown in FIGS. 2–12B can be applied to such an integrated circuit.

The additive circuit with the above-mentioned constitution can be used when the dynamic performances of the memory block and high-speed logic block in the semiconductor device integrated circuit comprising the memory block, the high-speed logic block, and a peripheral logic block controlling them are evaluated from the outside using a tester.

In the above-mentioned embodiments, MOS FETs are employed as the switching transistors connecting a plurality of lines or the lines and a reference line, and the separation transistors for preventing the multiple reflection of the signal by the memory block of the mixed logic and memory IC. These transistors, however, necessarily do not need to be formed by MOS FETs, but formed by bipolar transistors. The transistors can be replaced with any elements capable of switching. It is understood by those skilled in the art that various changes and modifications may be made in the invention without departing from the spirit and scope thereof.

The delay time between the bus lines of a mixed logic and memory IC has been manually measured. The present invention provides a simple additive circuit to the device, thereby not only the delay time difference of the bus lines extending from an external I/O terminal to the memory block can be measured using a tester with ease and in a short period of time, but also the outputting timing of a plurality of measuring pulse signals used for evaluating the dynamic performance of the memory block from the outside can be compensated. Therefore, when the dynamic performance of the memory block is evaluated using a tester, the memory can be accessed at a precise timing, and the evaluation time can be remarkably shortened thereby. The additive circuit of the present invention can be used for any semiconductor device integrated circuit in which the first and second logic blocks are formed on the same chip.

Additional advantages and modifications will readily occurs to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

We claim:

1. A semiconductor device integrated circuit in which at least a memory block and a logic block are formed on a chip, comprising:

the logic block having a plurality of input lines each connected to corresponding one of external I/O pads and a plurality of output lines each of which outputs control signals controlling operation of the memory block;

a plurality of select circuits each of which is connected to corresponding one of the external I/O pads at one end, for selecting either one of the output lines of the logic block or one of lines bypassing the logic block by receiving a select signal input from a select signal line;

bus lines each connected to corresponding one of output terminals of the select circuits at one end and connected to corresponding one of input terminals of the memory block at the other end;

a reference line arranged near the bus lines;

a reference pad located near the external I/O pads and connected to the reference line;

a plurality of switching transistors connecting at least one of the bus lines with the reference line; and an ON/OFF control line for controlling ON/Off of the switching transistors.

2. A semiconductor device integrated circuit according to claim 1, further comprising:

a control circuit as a substitute of the ON/OFF control line, for selecting at least one of the switching transistors and controlling ON/Off of the selected switching transistor;

an ON/OFF control line connected to an input terminal of the control circuit; and a control pad from which an external control signal for selecting the one of the switching transistors is input.

3. A semiconductor device integrated circuit according to claim 1, further comprising:

a plurality of separation transistors for separating the memory block at a portion adjacent to the input terminals of the memory block from the bus lines which connect each of the output terminals of the select circuits with the corresponding input terminal of the memory block; and a separation control line for controlling the separation transistors so as to separate the memory block from the bus lines.

4. A semiconductor device integrated circuit according to claim 2, further comprising:

a plurality of separation transistors for separating the memory block at a portion adjacent to the input terminal of the memory block from the bus lines which connect each of the output terminals of the select circuits with the corresponding input terminal of the memory block; and a separation control line for controlling the separation transistors so as to separate the memory block from the bus lines.

5. A semiconductor device integrated circuit in which at least a memory block and a logic block are formed on a chip, comprising:

the logic block having a plurality of input lines each connected to corresponding one of external I/O pads and a plurality of output lines each of which outputs control signals controlling operation of the memory block;

a plurality of select circuits, each of which is connected to corresponding one of the external I/O pads at one end, and for selecting either one of the output lines of the logic block or one of lines bypassing the logic block by receiving a select signal input from a select signal line;

bus lines each connected to corresponding one of output terminals of the select circuits at one end and connected to corresponding one of input terminals of the memory block at the other end;

a plurality of switching transistors connecting at least two of the bus lines; and an ON/OFF control line for controlling ON/Off of the switching transistors.

6. A semiconductor device integrated circuit according to claim 5, further comprising:

a control circuit as a substitute of the ON/OFF control line, for selecting at least one of the switching transistors and controlling ON/Off of the selected switching transistor;

an ON/OFF control line connected to an input terminal of the control circuit; and a control pad from which an external control signal for selecting the one of the switching transistors is input.

7. A semiconductor device integrated circuit according to claim 5, further comprising:

a plurality of separation transistors for separating at a portion adjacent to the input terminal of the memory block the memory block from the bus lines which connect each of the output terminals of the select circuits with the corresponding input terminal of the memory block; and a separation control line for controlling the separation transistors so as to separate the memory block from the bus lines.

8. A semiconductor device integrated circuit according to claim 6, further comprising:

a plurality of separation transistors for separating at a portion adjacent to the input terminal of the memory block the memory block from the bus lines which connect each of the output terminals of the select circuits with the corresponding input terminal of the memory block; and a separation control line for controlling the separation transistors so as to separate the memory block from the bus lines.

9. A semiconductor device integrated circuit in which at least a first logic block and a second logic block are formed on a chip, comprising:

the second logic block having a plurality of input lines each connected to one of external I/O pads and a plurality of output lines each of which outputs control signals controlling operation of the first logic block;

a plurality of select circuits each of which is connected to one of the external I/O pads at one end, for selecting either one of the output lines of the first logic block or one of lines bypassing the second logic block by receiving a select signal input from a select signal line;

bus lines each connected to corresponding one of output terminals of the select circuits at one end and connected to corresponding one of input terminals of the first logic block at the other end;

a reference line arranged near the bus lines;

a reference pad located near the external I/O pads and connected to the reference line;

a plurality of switching transistors connecting at least one of the bus lines with the reference line; and an ON/OFF control line for controlling ON/Off of the switching transistors.

10. A semiconductor device integrated circuit according to claim 9, further comprising:

a control circuit as a substitute of the ON/OFF control line, for selecting at least one of the switching transistors and controlling ON/Off of the selected switching transistor;

an ON/OFF control line connected to an input terminal of the control circuit; and a control pad from which an external control signal for selecting the one of the switching transistors is input.

11. A semiconductor device integrated circuit according to claim 9, further comprising:

a plurality of separation transistors for separating the first logic block at a portion adjacent to the input terminal of the first logic block from the bus lines which connect each of the output terminals of the select circuits with the corresponding input terminal of the first logic block; and a separation control line for controlling the separation transistors so as to separate the first logic block from the bus lines.

12. A semiconductor device integrated circuit according to claim 10, further comprising:

a plurality of separation transistors for separating the first logic block at the first logic block a portion adjacent to the input terminal of the first logic block from the bus lines which connect each of the output terminals of the select circuits with the corresponding input terminal of the first logic block; and a separation control line for controlling the separation transistors so as to separate the first logic block from the bus lines.

13. A semiconductor device integrated circuit in which at least a first logic block and a second logic block are formed on a chip, comprising:

the second logic block having a plurality of input lines each connected to one of external I/O pads and a plurality of output lines each of which outputs control signals controlling operation of the first logic block;

a plurality of select circuits, each of which is connected to corresponding one of the external I/O pads at one end, for selecting either one of the output lines of the logic block or one of lines bypassing the second logic block by receiving a select signal input from a select signal line;

bus lines each connected to corresponding one of output terminals of the select circuits at one end and connected to corresponding one of input terminals of the first logic block at the other end;

a plurality of switching transistors connecting at least two of the bus lines; and an ON/OFF control line for controlling ON/Off of the switching transistors.

14. A semiconductor device integrated circuit according to claim 13, further comprising:

a control circuit as a substitute of the ON/OFF control line, for selecting at least one of the switching transistors and controlling ON/Off of the selected switching transistor;

an ON/OFF control line connected to an input terminal of the control circuit; and a control pad from which an external control signal for selecting the one of the switching transistors is input.

15. A semiconductor device integrated circuit according to claim 13, further comprising:

a plurality of separation transistors for separating at a portion adjacent to the input terminal of the first logic block the first logic block from the bus lines which connect each of the output terminals of the select circuits with the corresponding input terminal of the first logic block; and a separation control line for controlling the separation transistors so as to separate the first logic block from the bus lines.

16. A semiconductor device integrated circuit according to claim 14, further comprising:

a plurality of separation transistors for separating at a portion adjacent to the input terminal of the first logic block the first logic block from the bus lines which connect each of the output terminals of the select circuits with the corresponding input terminal of the first logic block; and a separation control line for controlling the separation transistors to separate the first logic block from the bus lines.

* * * * *